(12) United States Patent
Hynecek

(10) Patent No.: US 8,497,546 B2
(45) Date of Patent: Jul. 30, 2013

(54) BACK-SIDE-ILLUMINATED IMAGE SENSORS WITH BULK-CHARGE-MODULATED IMAGE SENSOR PIXELS

(75) Inventor: Jaroslav Hynecek, Allen, TX (US)

(73) Assignee: Aptina Imaging Corporation, George Town (KY)

( * ) Notice: Subject to any disclaimer, the term of this patent is extended or adjusted under 35 U.S.C. 154(b) by 416 days.

(21) Appl. No.: 13/008,784

(22) Filed: Jan. 18, 2011

(65) Prior Publication Data

US 2012/0181581 A1   Jul. 19, 2012

(51) Int. Cl.
*H01L 29/788* (2006.01)

(52) U.S. Cl.
USPC ......... 257/323; 257/E27.133; 438/59; 438/72

(58) Field of Classification Search
USPC ................... 257/323, E27.133; 438/59, 73
See application file for complete search history.

(56) References Cited

U.S. PATENT DOCUMENTS

| | | | |
|---|---|---|---|
| 4,901,129 A | | 2/1990 | Hynecek |
| 5,424,223 A | * | 6/1995 | Hynecek .................. 438/59 |
| 5,500,383 A | * | 3/1996 | Hynecek .................. 438/60 |
| 5,625,210 A | | 4/1997 | Lee et al. |
| 6,657,665 B1 | | 12/2003 | Guidash |

* cited by examiner

*Primary Examiner* — Long Pham
*Assistant Examiner* — Steven Rao
(74) *Attorney, Agent, or Firm* — Treyz Law Group; Jason Tsai

(57) ABSTRACT

Image sensor arrays may include bulk-charge-modulated-device (BCMD) sensor pixels. The BCMD sensor pixels may be used in back-side-illuminated (BSI) image sensors. A BCMD sensor pixel need not include a dedicated addressing transistor. The BCMD sensor pixel may include a gated drain reset (GDR) structure that is used to perform reset operations. The GDR structure may be shared among multiple pixels, which provides increased charge storage capacity for high resolution image sensors. A negative back body bias may be applied to the BCMD pixel array, allowing the depletion region under each BCMD pixel to extend all the way to the back silicon surface. Extending the depletion region by negatively biasing the back silicon surface may serve to minimize pixel crosstalk.

22 Claims, 5 Drawing Sheets

BACK-SIDE-ILLUMINATED IMAGE SENSORS WITH BULK-CHARGE-MODULATED IMAGE SENSOR PIXELS

BACKGROUND

Typical complementary metal-oxide-semiconductor (CMOS) image sensors sense light by converting impinging photons into electrons that are integrated (collected) in sensor pixels. Once the integration cycle is complete, collected charge is converted into a voltage signal, which is supplied to output terminals of an image sensor. This charge to voltage conversion is performed within each sensor pixel. The pixel output voltage (i.e., an analog voltage signal) is transferred to the output terminals using various pixel addressing and scanning schemes. The analog voltage signal can also be converted on-chip to a digital equivalent before reaching the chip output.

The sensor pixels include buffer amplifiers (i.e., source followers) that drive sensing lines connected to the pixels through address transistors. After the charge to voltage conversion and after the resulting voltage signal has been read out from the pixels, the pixels are reset in preparation for a successive charge accumulation cycle. In pixels that include floating diffusions (FD) serving as charge detection nodes, the reset operation is performed by turning on a reset transistor that connects the floating diffusion node to a voltage reference.

Removing charge from the floating diffusion node using the reset transistor, however, generates kTC-reset noise as is well known in the art. The kTC noise must be removed using correlated double sampling (CDS) signal processing techniques in order to achieve desired low noise performance. Typical CMOS image sensors that utilize CDS require at least three or four transistors (4T) per pixel. An example of the 4T pixel circuit with a pinned photodiode can be found in Lee (U.S. Pat. No. 5,625,210).

In modern CMOS image sensor designs, circuitry associated with multiple photo-diodes may be shared, as can be found for example in Guidash U.S. Pat. No. 6,657,665. In Guidash, a sensor pixel consists of two photo-diodes located in neighboring rows. The two photo-diodes located in the neighboring rows share the same circuitry. Sharing circuitry in this way can result in having only two metal bus lines in the row direction and two metal bus lines in the column direction per photo-diode, as shown in FIG. 1.

This is useful for designing small pixels or pixels with high fill factor (FF), because the minimum pixel size is dependent on the spacing and width of the metal bus lines. This is also illustrated in FIG. 1, where drawing 100 represents the schematic diagram of a shared circuit pixel with two photo-diodes 107 and 108. Photo-diodes 107 and 108 are coupled to common floating diffusion charge detection node 115 through charge transfer transistors 109 and 110. FD node 115 is connected to the gate of source follower (SF) transistor 112. SF transistor 112 has a drain that is connected to Vdd column bus line 101 (i.e., a positive power supply line on which positive power supply voltage Vdd is provided) via line 116. SF transistor 112 has a source that is connected to output signal column bus line 102 via address (Sx) transistor 113 and line 117.

FD node 115 is reset using transistor 111. Reset transistor 111 has a drain that is connected to line 116 and a source that is connected to node 115. Address transistor 113, reset transistor 111, and charge transfer transistors 109 and 110 are controlled using control signals supplied over row bus lines 114, 106, 104, and 105, respectively.

As shown in FIG. 1, the circuit that has two photodiodes. This particular image sensor therefore has two row bus lines and two column bus lines per photodiode. In many cases, however, it is also necessary to provide an additional connection between transistor 110 and FD node 115, as indicated by wire 103. This additional connection reduces the pixel fill factor.

Photodiodes 107 and 108 are formed in a semiconductor substrate having a front surface and a back surface. The associated pixel transistors (i.e., reset transistor 111, charge transfer transistors 109 and 110, source follower transistor 112, and address transistor 113) are formed at the front surface of the substrate. A dielectric stack that includes metal interconnect layers and oxide layers may be formed over the pixel transistors on the front surface of the substrate.

In conventional front-side-illuminated image sensors, light enters the image sensor from the front side of the substrate. The quantum efficiency of photon-to-electron conversion may be reduced because the incoming light has to travel through the dielectric stack. Wires formed in the metal routing layers may obstruct a portion of the incoming light. The pixel well capacity (i.e., a pixel's capability to store electrons) may also be reduced when a large number of transistors are used, because the transistors take up valuable integrated circuit area that could instead be used to form a larger pixel charge storage well.

It may therefore be desirable to illuminate sensor pixels from the back surface of the substrate where no wiring is obstructing the light. It may also be desirable to adopt the bulk-charge-modulated-device (BCMD) configuration in which a single transistor is used for pixel addressing, charge sensing, signal buffering, and charge reset. Description of the BCMD concept can be found in U.S. Pat. No. 5,424,223 and U.S. Pat. No. 4,901,129 both to Hynecek, which are hereby incorporated by reference herein in their entireties.

In a conventional BCMD pixel, charge is stored under the channel of a BCMD transistor. The amount of stored charge modulates the BCMD transistor's threshold voltage. The change in threshold voltage is sensed when a current is directed to flow through the BCMD transistor. After charge sensing has been completed, the pixel is reset by removing the collected charged. In the conventional BCMD pixel, charge is removed from the pixel in a vertical direction. This may be a disadvantage if used in conjunction with the back-side-illumination (BSI) sensor arrangement, because the vertical structure of the reset transistor may block incoming light and reduce light sensitivity.

Lateral reset structures that provide charge reset in a horizontal direction (i.e., charge transfer parallel to the surface of the substrate) have previously been developed in BSI applications. For example, a lateral reset structure is described in U.S. Pat. No. 5,424,233 to Hynecek. Although this type of lateral reset structure is often satisfactory, in some applications, such as applications involving high resolution image sensors, further reductions in pixel size may be desired.

It would therefore be desirable to be able to provide improved image sensors.

DETAILED DESCRIPTION

Figure 2:
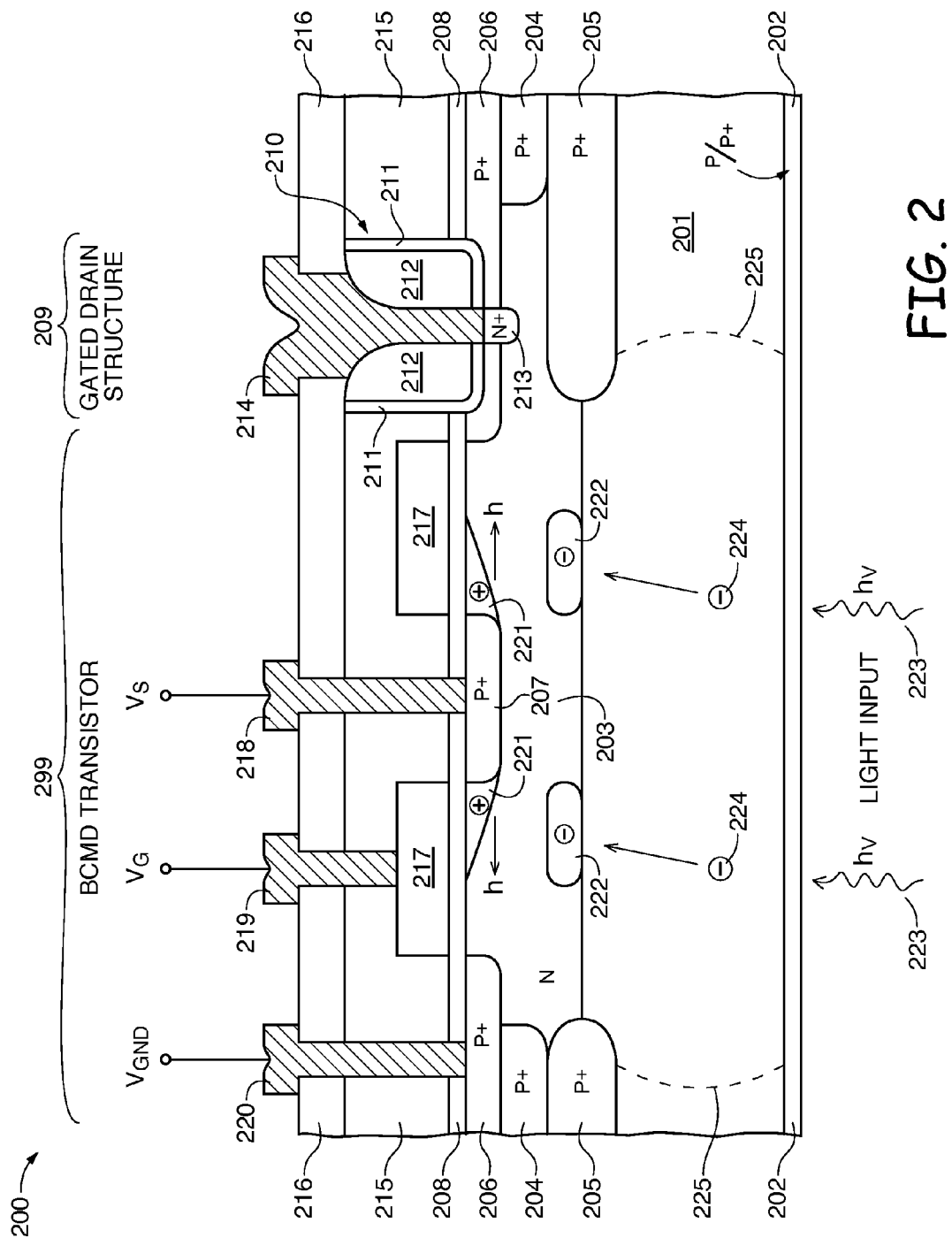
FIG. 2 is a cross-sectional side view of an illustrative back-side-illuminated (BSI) bulk-charge-modulated-device (BCMD) pixel with a gated drain reset structure in accordance with an embodiment of the present invention.

In FIG. 2, drawing 200 shows a cross-sectional side view of a back-side-illuminated (BSI) bulk-charge-modulated-device (BCMD) pixel and associated gated drain reset (GDR) reset structure 209 (sometimes referred to as a gated diode reset structure). An image sensor may be formed from an array of pixels such a pixel 200 arranged in rows and columns. The image sensor pixels may be fabricated on a substrate such as p-type semiconductor substrate 201. Substrate 201 has a top (front) surface and a bottom (back) surface. Image sensing circuitry such as transistors and interconnect structures may be formed on the front side of substrate 201. A p+ type doping layer such as p+ doping layer 202 may be formed on the bottom surface of substrate 201 (see, e.g., FIG. 2).

During operation, image light may be received by the image sensing circuitry through the backside (rear surface) of substrate 201. In particular, the rear surface of the pixel array (i.e., the backside of the semiconductor substrate) may be exposed to an image to be captured. Photons (image light) 223 may enter substrate 201 through the back surface and generate carriers (e.g., electron-hole pairs including electrons 224) in the depleted and non-depleted regions in substrate 201. The holes may be swept into p+ regions 205. The pixel may have transistors that are biased to induce an electric field that causes electrons 224 to drift into charge storage region 222. A BCMD transistor such as BCMD transistor 299 (sometimes referred to as a bulk charge modulated device or bulk charge modulated transistor) may be formed in the front surface of substrate 201. Region 203 of transistor 299 is sometimes referred to as the bulk terminal, bulk, bulk region, body, body terminal, or body region of transistor 299. The electrons that are temporarily stored in region 222 of bulk region 203 modulate the threshold of BCMD transistor 299.

Gate oxide layer 208 may substantially cover the entire surface of the pixel array. BCMD transistor 299 may include gate structure 217 (e.g., a polysilicon gate structure, a metal gate structure, or other types of conductive gate structures). Gate structure 217 may be formed in a ring-shaped pattern surrounding a p+ type shallow doped source region such as region 207. Transistor 299 may also include a p+ type doped drain region such as region 206 that fills the rest of the pixel area and the remaining regions between each neighboring pixel in the array. The terms source and drain may sometimes be used interchangeable and may collectively be referred to as source-drains, source-drain regions, oxide definition regions, diffusion regions, etc. Drain region 206 may be shorted to substrate 201 (e.g., the drain terminal of transistor 299 may be shorted to ground).

Holes 221 may be conveyed through the channel of transistor 299 (e.g., holes 221 may flow from source 207 to drain 206 when gate 217 is suitably biased). The transistor channel may be formed at the surface of n-type doped region 203 (i.e., the bulk region for transistor 299, sometimes referred to as the transistor's body, body terminal, or body region).

Electrical contacts to the various transistor regions are provided by contact via (plug) 220 to drain 206 (biased at ground potential), contact via 219 to gate 217, and contact via 218 to source 207. P+ type doped regions 204 and regions 205 located deeper in substrate 201 provide separation (isolation) between adjacent pixels. This pixel separation doping defines depletion region edge 225 that extends all the way to layer 202 at the bottom surface of substrate 201. Separating adjacent pixels using this approach minimizes cross talk. P+ layer 202 may serve to minimize dark current generated at the interface of layer 201 and 202.

As shown in FIG. 2, gated drain reset (GDR) structure 209 may be fabricated by etching hole 210 in the interlayer oxide 215 deposited on the array after polysilicon gates 217 have been formed. If desired, the etched hole may partially protrude into the front surface of the silicon substrate to remove some of the p+ doping 206 from this region. An additional thin layer of oxide 211 may be deposited into the etched hole. Polysilicon spacers 212 may then be formed along the side walls of the etched hole. In a subsequent step, oxide layer 216 may be formed over layer 215. Additional etching may be used to remove thin oxide layer 211 at the bottom of the etched hole to expose a contact area. This step may be followed by implantation of n+ drain region 213 and deposition of metal contact 214 (see, e.g., FIG. 2). A number of heat treatment cycles may be used to anneal the deposited materials during the various implantation procedures. Description of these steps, which are well known to those skilled in the art, has been omitted for simplicity.

GDR structure 209 may sometimes be referred to as a lateral reset device because it transfers charge in a direction parallel to the front surface of the substrate. Region 213 may serve as a source-drain region for GDR structure 209, whereas polysilicon spacer 212 may serve as a conductive gate for GDR structure 209. As shown in FIG. 2, n+ drain region 214 may be shorted to gate 212 using metal contact 214. During reset operations, electrons 224 stored in regions 222 may flow under layers 206 and 211 into spacer 212 to reset BCMD transistor 299.

In another suitable arrangement, the GDR structure may be formed by defining another doped polysilicon ring in place of polysilicon spacers 212 during fabrication of BCMD gate structures 217. Forming the GDR structure using this approach may reduce manufacturing complexity and cost. Metal plug 214 may be formed within this ring to make an electrical contact with n+ region 213, as described in connection with FIG. 2.

Figure 6:
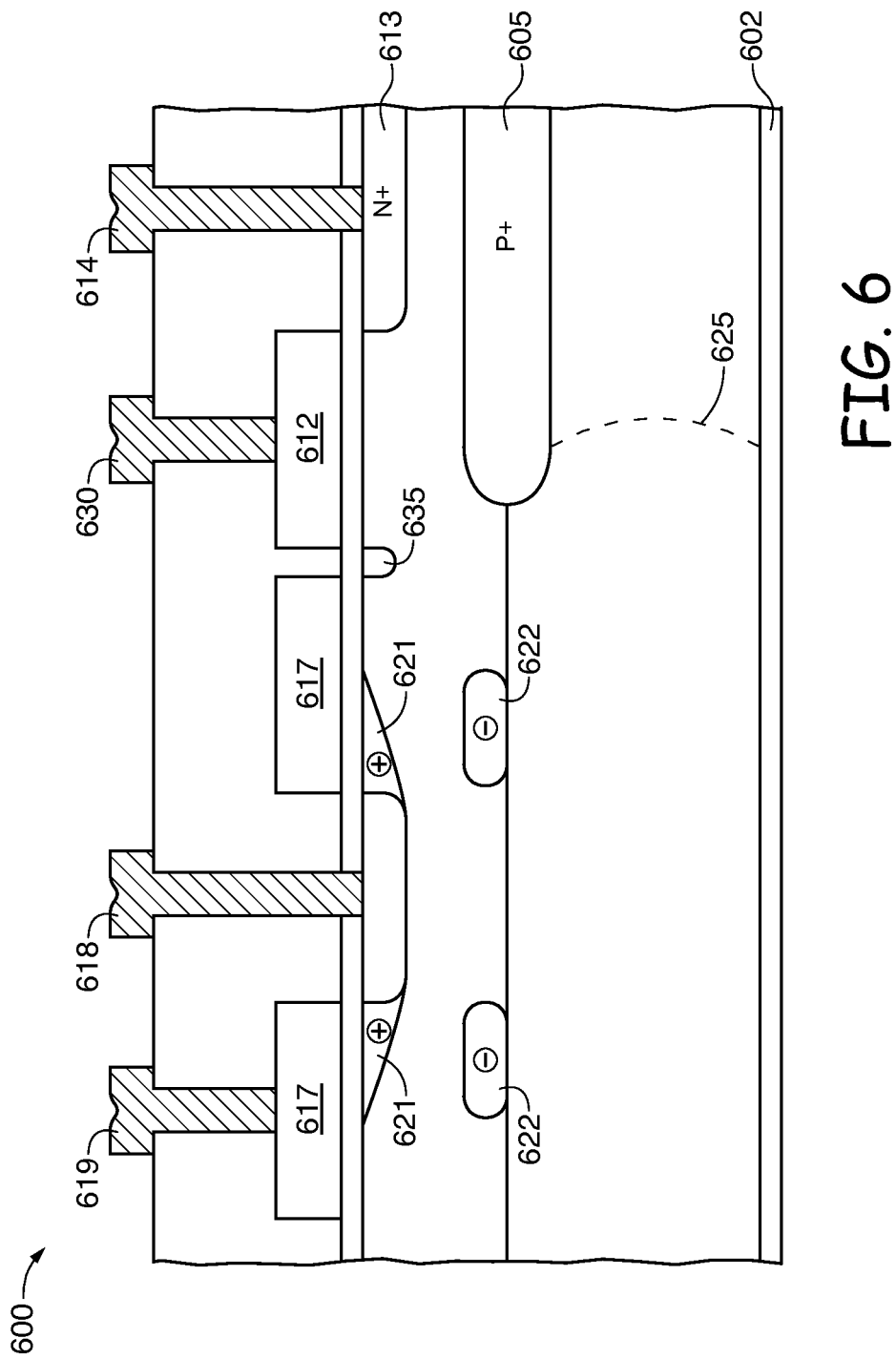
FIG. 6 is a cross-sectional side view of an illustrative back-side-illuminated (BSI) bulk-charge-modulated-device (BCMD) pixel with a reset structure in accordance with an embodiment of the present invention.

Another suitable embodiment is shown in FIG. 6. As shown in drawing 600 of FIG. 6, the GDR structure includes drain 613 and gate 612 that are now biased independently through via 614 and 630, respectively. It is also possible to connect the gate and drain to a single via as shown in the previous embodiment where via 214 connects to both gate 212 and drain 213. Gate 612 can have a simple rectangular structure or a doughnut shaped enclosed structure similar to the GDR shown in FIG. 3. Structures 602, 605, 613, 614, 617, 618, 621, 622, and 625 of FIG. 6 correspond to structures 202, 205, 213, 214, 217, 218, 221, 222, and 225 of FIG. 2. The additional region 635 between the gates 617 and 612 is formed by a suitable implant to provide a smooth potential profile transition from charge storage region 622 to drain 613 when gate 612 is turned on.

In another suitable arrangement, the GDR structure may be formed using the ring-shaped pattern described in connection with BCMD transistor 299. For example, a ring-shaped gate structure may form a hole through which a first source-drain region (e.g., an n+ drain region) is formed. A second source-drain region of the GDR structure may be formed adjacent to the ring-shaped gate structure. Polysilicon spacers need not be formed in this scenario. The first source-drain region of the GDR structure may be coupled to a first metal plug, whereas the ring-shaped gate structure may be coupled to a second metal plug. The first and second metal plugs may be shorted to connect the gate to the first source-drain. If desired, the first and second metal plugs need not be shorted but may be biased using the same voltage signal.

In yet another suitable arrangement, n-type doping region 203 may be extended under p+ type doping layer 205. Extending region 203 under layer 205 may serve to block current from flowing between ground contact 220 and substrate p+ region 202 (e.g., so that region 202 is not shorted with ground contact 220). Isolating the two in this way may allow layer 202 to be biased to a negative potential instead of the ground potential, which helps extend depletion region boundary 225 all the way down to the back surface of substrate 201, as shown in FIG. 2. Extended depletion region 225 minimizes cross talk between the pixels in the array (e.g., prevents lateral electron diffusion between adjacent pixels).

If desired, BCMD transistor 299 may be an n-channel transistor. For example, source-drain regions 206 and 207 may be n+ doped regions, well 203 may be a p-type doped well, drain region 213 may be a p+ doped region, etc.

Figure 3:
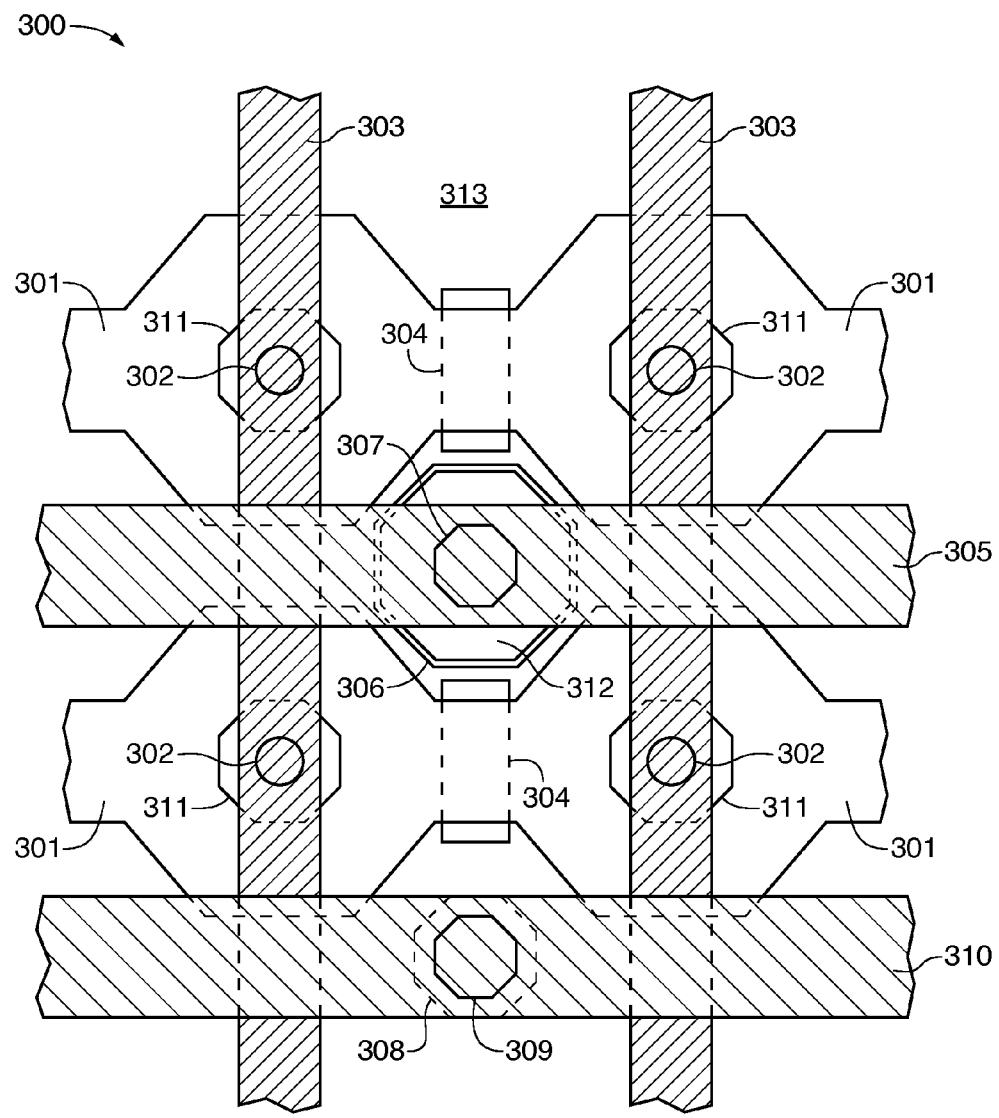
FIG. 3 is a top layout view of four BSI BCMD pixels sharing a common reset structure in accordance with an embodiment of the present invention.

FIG. 3 is a top view of an illustrative pixel array floor plan. Only a group of 2 by 2 pixels is shown. A pixel array may, however, contain hundreds or thousands of image sensor pixels arranged using this configuration. As shown in drawing 300, a group of four pixels are coupled to a common shared GDR structure (as an example). The GDR structure may be shared by any number of pixels. The gate structures 301 of each BCMD transistor along a row may be contiguous, because the gate structure of each BCMD transistor is coupled to a common row control line (not shown in FIG. 3).

Region 304 in FIG. 3 corresponds to p+ type shallow implant region 206 of FIG. 2. Region 304 may be formed before polysilicon structure 301 has been deposited. In arrangements in which gate structures 301 of the different pixel along a row are not contiguous and are strapped together only using a row metal bus, implant 304 may be omitted.

Region 311 in FIG. 3 corresponds to p+ type source region 207 of FIG. 2. Source region 311 of each BCMD transistor arranged along a column may be coupled to a common column output line 303 via contact plugs 302. Ground contact via 309 may connect p+ type doping region 308 to row bus line 310. A ground voltage may be conveyed over row bus line 310 to bias the drain of each BCMD transistor to ground.

The GDR structure may be formed in hole region 306. Doped polysilicon spacer 312 may be formed in hole region 306 to form contact hole 307. Contact hole 307 may be filled with conductive material (e.g., tungsten, copper, aluminum, or other suitable types of metal) to connect the n+ type drain of the GDR structure to reset bus line 305. If desired, more than one GDR structure may be formed around each BCMD transistor. Only two metal routing layers are needed to wire the image pixel array of FIG. 3.

Figure 4:
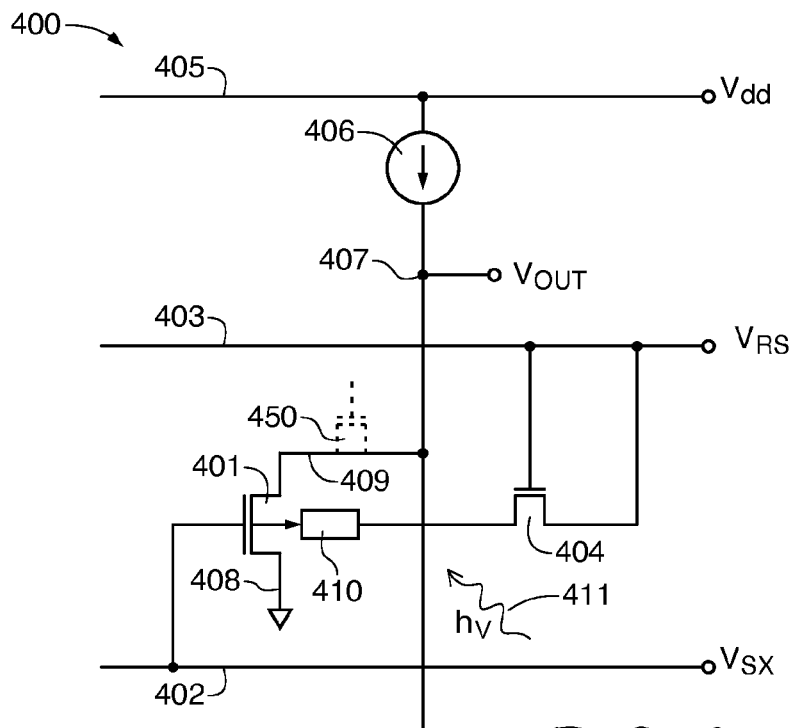
FIG. 4 is a schematic diagram of an illustrative pixel circuit that includes a gated drain reset structure in accordance with an embodiment of the present invention.

In FIG. 4, drawing 400 is a circuit diagram of the BCMD pixel. Row addressing signal Vsx may be applied to the gate of p-channel BCMD transistor 401 using control line 402. The assertion of row address signal Vsx enables transistor 401 to generate a corresponding output voltage signal at its source terminal 409. The output voltage signal is driven onto column line 407 (e.g., a column line to which all remaining unaddressed transistors are connected). Column line 407 may be biased by power supply line 405 using current source 406. The drain of transistor 401 may be connected to ground via connection 408 (e.g., the device substrate or a separate bus line shorted to ground outside the pixel array). The separate connection to ground may be necessary when the p+ back substrate is biased to a different potential than ground and is separated from the p+ ground contact by vertical current blocking implant, as described in connection with FIG. 2.

Figure 1:
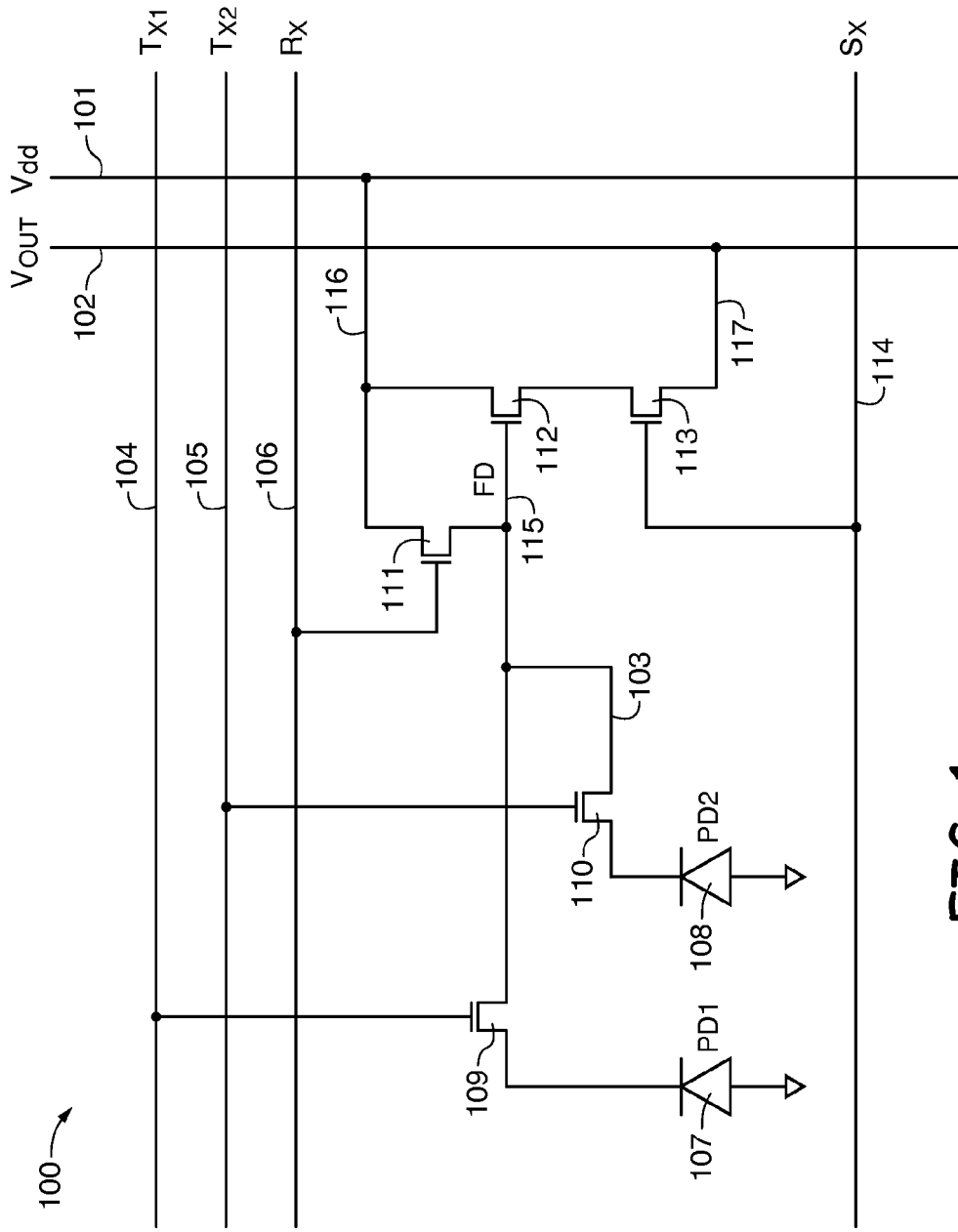
FIG. 1 is a schematic diagram of a conventional pixel circuit with two pinned photodiodes that share addressing and reset circuitry.

In contrast to the conventional pixel circuit described in connection with FIG. 1, the pixel circuit of FIG. 4 does not have a dedicated addressing transistor. Addressing an individual pixel may be accomplished by asserting signal Vsx. If desired, an address transistor such as address transistor 450 may be coupled between the source of BCMD transistor 401 and line 407 (e.g., the source of BCMD transistor 401 may be coupled to line 407 through address transistor 450). Including address transistor 450 may introduce an additional row bus line on which address signals may be conveyed to turn on and turn off the address transistor.

As shown in drawing 400, GDR structure 404 may have a first terminal coupled to reset line 403 and a second terminal coupled to the BCMD transistor bulk well 410. Photons 411 entering the device substrate generate electrons that are collected in well 410 (corresponding to n-well region 222 in FIG. 2). Asserting reset signal Vrs on reset line 403 removes all the charge stored in well 410 without generating kTC noise.

GDR structure 404 can also be used for blooming control by removing overflow charge during the signal integration period. For example, a suitable bias may be applied to the gated drain to remove a portion of the stored charge during the signal integration phase. When the bias is raised high, all the stored charge is removed from well 410 to reset the pixel.

Figure 5:
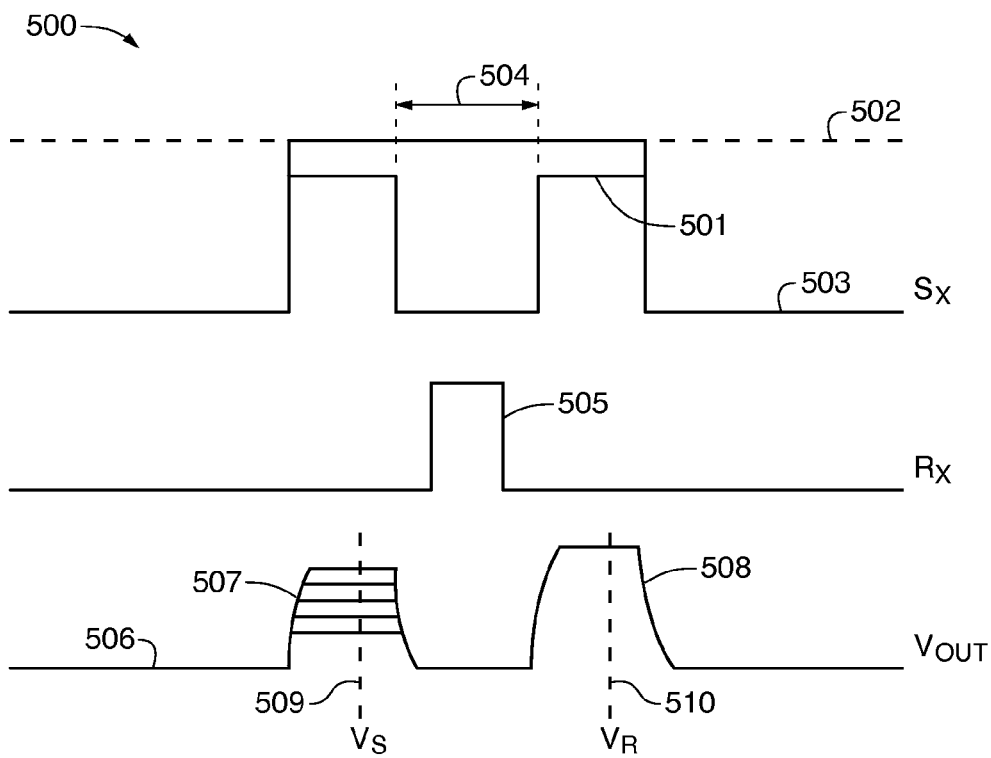
FIG. 5 is a timing diagram illustrating the behavior of relevant signals during operation of the pixel circuit of FIG. 4 in accordance with an embodiment of the present invention.

An example of the timing pulses that may be applied to the BCMD pixel is shown in timing diagram 500 in FIG. 5. Line 503 represents the level of signal Vsx that can be applied to the gates of the BCMD transistors in a selected pixel row during signal readout operations (e.g., not during signal integration period). The selected row bias may be held at level 501, whereas all other non-selected rows may be biased at level 502. During reset interval 504, the selected row may be biased to the original low level, and reset pulse 505 may be applied to the GDR drain (i.e., signal Vrs may be pulsed high) to reset the selected pixels.

During the charge integration period, all the BCMD transistor gates may be biased low (e.g., signal Sx is low) to allow holes to accumulate at the transistor gate oxide-silicon interface, thereby reducing dark current. Other biasing and pulsing schemes may be used to operate the BCMD pixel, which is well known to those skilled in the art. The output signal appears after the selected pixel is address, as indicated by line 506. Depending on the amount of charged stored, signal Vout will exhibit various output signal levels 507.

After charge reset is complete, an empty well reference signal may be sensed, as indicated by pulse 508. The level of Vout may be sampled during charge readout (e.g., level Vs measured at time 509), whereas the reference level may be sampled following charge reset (e.g., level Vr measured at time 510). The amount of charge can then be found by calculating the difference between Vr and Vs. Various signal processing schemes may be used in operating the BCMD pixel, including the use of analog-to-digital conversion to digital signals, which are all well known to those skilled in the art.

There are many modifications possible to the invention and to the particular embodiment described in connection with FIGS. 2-5. In summary, image sensors may be fabricated using the BCMD pixel design. A BCMD pixel may provide lateral charge reset capability that can be used in high performance and high density back side illuminated CMOS image sensor arrays. The BCMD pixel need not include a dedicated addressing transistor and may only have one column bus line per pixel. The BCMD pixel with the lateral reset structure exhibits high charge storage capacity. The pixel charge storage capacity is high, because the lateral reset structure may be shared among multiple neighboring photodiodes. The lateral reset structure may be formed using a lateral gated drain structure that does not significantly increase pixel size and improves pixel performance in comparison to vertical reset structures.

The foregoing is merely illustrative of the principles of this invention which can be practiced in other embodiments.

What is claimed is:

1. A backside-illuminated image sensor, comprising:
   image sensing circuitry; and
   a semiconductor substrate having a front surface on which the image sensing circuitry is formed and having a back surface through which image light is received, wherein the image sensing circuitry includes at least one bulk charge modulated transistor, wherein the bulk charge modulated transistor comprises one of a plurality of bulk charge modulated transistors in the backside-illuminated image sensor, wherein the bulk charge modulated transistors each comprise a bulk region in which carriers are generated by the image light, and wherein the bulk charge modulated transistors each comprise a gate; and
   at least one reset device configured to reset four of the bulk charge modulated transistors.

2. The backside-illuminated image sensor defined in claim 1 wherein the bulk charge modulated transistor comprises a p-channel metal-oxide-semiconductor transistor.

3. The backside-illuminated image sensor defined in claim 2 wherein the image sensing circuitry comprises at least one control line and wherein the gate of the bulk charge modulated transistor is coupled to the control line.

4. The backside-illuminated image sensor defined in claim 3 wherein the bulk charge modulated transistor comprises a first source-drain region coupled to an output terminal and a second source-drain region coupled to a power supply terminal at a fixed power supply voltage.

5. The backside-illuminated image sensor defined in claim 4 wherein the power supply terminal comprises a ground power supply terminal and wherein the fixed power supply voltage comprises a ground voltage.

6. The backside-illuminated image sensor defined in claim 1 wherein the bulk charge modulated transistor comprises a bulk region in which carriers are generated by the image light, wherein the gate of the bulk charge modulated transistor is formed in a gate region, wherein the gate region has an opening, and wherein the bulk charge modulated transistor comprises at least one source-drain region in the opening.

7. The backside-illuminated image sensor defined in claim 1 wherein the gates of the plurality of bulk charge modulated transistors are formed by a common gate conductor.

8. The backside-illuminated image sensor defined in claim 7 wherein the gate conductor comprises a plurality of holes and wherein the bulk charge modulated transistors each have at least one source-drain region that is located in a respective one of the plurality of holes.

9. The backside-illuminated image sensor defined in claim 1, further comprising:
   an additional substrate layer formed at the back surface of the semiconductor substrate, wherein the additional substrate layer is biased at a negative potential level.

10. A backside-illuminated image sensor, comprising:
    a lateral reset device;
    a bulk charge modulated transistor;
    a semiconductor substrate having a front surface on which the lateral reset device and bulk charge modulated transistor are formed and having a back surface through which image light is received, wherein the lateral reset device transfers charge in a direction parallel to the front surface of the semiconductor substrate; and
    an additional substrate layer formed at the back surface of the semiconductor substrate, wherein the additional substrate layer is biased at a negative potential level.

11. The backside-illuminated image sensor defined in claim 10 wherein the bulk charge modulated transistor comprises a bulk region in which carriers are generated by the image light.

12. The backside-illuminated image sensor defined in claim 11 wherein the lateral reset device comprises a polysilicon spacer.

13. The backside-illuminated image sensor defined in claim 12 wherein the polysilicon spacer comprises a hole and wherein the lateral reset device further comprises a metal structure that is located at least partly in the hole and that is shorted to the polysilicon spacer.

14. The backside-illuminated image sensor defined in claim 13 wherein the lateral reset device further comprises a heavily doped region that is electrically connected to the metal structure and that is electrically connected to the bulk region.

15. The backside-illuminated image sensor defined in claim 14 wherein the lateral reset device further comprises an insulating layer interposed between at least some of the bulk regions and the polysilicon spacer.

16. The backside-illuminated image sensor defined in claim 15 wherein the bulk charge modulated transistor comprises a p-channel metal-oxide-semiconductor transistor.

17. The backside-illuminated image sensor defined in claim 10, wherein the lateral reset device comprises a ring-shaped gate structure.

18. The backside-illuminated image sensor defined in claim 17, further comprising:
    an implant region that is formed in the front surface and that is interposed between the ring-shaped gate structure and the bulk charge modulated transistor.

19. A backside-illuminated image sensor, comprising:
    an output line;
    a bulk charge modulated transistor;
    an address transistor coupled between the bulk charge modulated transistor and the output line;
    a semiconductor substrate having a front surface on which the bulk charge modulated transistor is formed and having a back surface through which image light is received; and
    a reset device, wherein the reset device is formed in the front surface of the semiconductor substrate, wherein the reset device comprises:
    a polysilicon spacer;
    a metal structure; and
    a heavily doped region, wherein the polysilicon spacer comprises a hole, wherein the metal structure is located at least partly in the hole and is shorted to the polysilicon spacer, and wherein the heavily doped region is electrically connected to the metal structure and is electrically connected to the bulk region.

20. The backside-illuminated image sensor defined in claim 19 wherein the bulk charge modulated transistor comprises a bulk region in which carriers are generated by the image light.

21. The backside-illuminated image sensor defined in claim 20 wherein the bulk charge modulated transistor comprises a p-channel metal-oxide-semiconductor transistor.

22. The backside-illuminated image sensor defined in claim 19 further comprising at least one control line, wherein the bulk charge modulated transistor comprises a gate region coupled to the control line, a first source-drain region coupled to the output line, and a second source-drain region coupled to a power supply terminal at a fixed power supply voltage.

* * * * *